United States Patent
Yang et al.

(10) Patent No.: US 12,389,684 B2
(45) Date of Patent: Aug. 12, 2025

(54) DUMMY PIXEL CIRCUIT, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Huijuan Yang, Beijing (CN); Maoying Liao, Beijing (CN); Yang Zhou, Beijing (CN); Lu Bai, Beijing (CN); Jie Dai, Beijing (CN); Dan Cao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 83 days.

(21) Appl. No.: 17/915,421

(22) PCT Filed: Oct. 29, 2021

(86) PCT No.: PCT/CN2021/127268
§ 371 (c)(1),
(2) Date: Sep. 28, 2022

(87) PCT Pub. No.: WO2022/213585
PCT Pub. Date: Oct. 13, 2022

(65) Prior Publication Data
US 2024/0213263 A1    Jun. 27, 2024

(30) Foreign Application Priority Data

Apr. 7, 2021 (CN) .......................... 202110373291.9

(51) Int. Cl.
*G09G 3/18* (2006.01)
*H10D 86/40* (2025.01)
*H10D 86/60* (2025.01)

(52) U.S. Cl.
CPC ........... *H10D 86/60* (2025.01); *H10D 86/411* (2025.01); *H10D 86/441* (2025.01)

(58) Field of Classification Search
CPC .... G09G 3/32; G09G 2320/033; H10D 86/60; H10D 86/411; H10D 86/441
See application file for complete search history.

(56) References Cited

U.S. PATENT DOCUMENTS 11,361,713 B1 * 6/2022 Fu ........................ G09G 3/3241
11,793,034 B2 * 10/2023 Wang ................... H10K 59/122
                                                              345/76

(Continued)

FOREIGN PATENT DOCUMENTS

CN    105612620 A    5/2016
CN    108054174 A    5/2018

(Continued)

OTHER PUBLICATIONS

CN202110373291.9 first office action.
CN202110373291.9 Notification to grant patent right for invention.

*Primary Examiner* — Joe H Cheng
(74) *Attorney, Agent, or Firm* — IPro, PLLC

(57) ABSTRACT

Provided is a dummy pixel circuit. The dummy pixel circuit is applicable to a display panel provided with two through vias and disposed between the two through vias, and includes a pixel sub-circuit and a dummy sub-circuit. The pixel sub-circuit includes one or more first transistors, wherein a control electrode of the first transistor is electrically connected to the first gate line. The dummy sub-circuit includes one or more second transistors, wherein a control electrode of the dummy sub-circuit is electrically connected (Continued)

to the first gate line, a first electrode of the second transistor is electrically connected to a first electrode of a corresponding one of the one or more first transistors, and a second electrode of the second transistor is electrically connected to a second electrode of the corresponding first transistor. One of the first transistors corresponds to at least one of the second transistors.

20 Claims, 12 Drawing Sheets

(56) References Cited

U.S. PATENT DOCUMENTS

| | | | | |
|---|---|---|---|---|
| 2006/0061524 | A1* | 3/2006 | Suh | G09G 3/3216 |
| | | | | 345/76 |
| 2015/0294618 | A1 | 10/2015 | Park et al. | |
| 2016/0189644 | A1* | 6/2016 | So | G09G 3/3233 |
| | | | | 345/103 |
| 2018/0342572 | A1 | 11/2018 | Park et al. | |
| 2019/0096978 | A1 | 3/2019 | Jung et al. | |
| 2020/0176526 | A1 | 6/2020 | Yoon et al. | |
| 2020/0176527 | A1 | 6/2020 | An et al. | |
| 2020/0258952 | A1 | 8/2020 | Bok et al. | |
| 2022/0199004 | A1 | 6/2022 | Yao et al. | |
| 2023/0117888 | A1* | 4/2023 | Du | H10K 59/131 |
| | | | | 345/55 |
| 2024/0054927 | A1* | 2/2024 | Park | G09G 3/006 |
| 2024/0363079 | A1* | 10/2024 | Li | H10K 59/131 |

FOREIGN PATENT DOCUMENTS

| | | |
|---|---|---|
| CN | 108933159 A | 12/2018 |
| CN | 109949737 A | 6/2019 |
| CN | 111048573 A | 4/2020 |
| CN | 111261043 A | 6/2020 |
| CN | 111261085 A | 6/2020 |
| CN | 111540771 A | 8/2020 |
| CN | 111554706 A | 8/2020 |
| CN | 111599282 A | 8/2020 |
| CN | 111710239 A | 9/2020 |
| CN | 113096588 A | 7/2021 |
| EP | 3300067 A2 | 3/2018 |
| EP | 3113226 B1 | 5/2019 |

* cited by examiner

DUMMY PIXEL CIRCUIT, DISPLAY PANEL AND DISPLAY DEVICE

CROSS-REFERENCE TO RELATED APPLICATION

This application is a U.S. national phase application based on PCT/CN2021/127268, filed on Oct. 29, 2021, which claims priority to Chinese Patent Application No. 202110373291.9, filed on Apr. 7, 2021, and entitled "DUMMY PIXEL CIRCUIT, DISPLAY PANEL, AND DISPLAY DEVICE," the disclosures of which are herein incorporated by reference in their entireties.

TECHNICAL FIELD

The present disclosure relates to the field of display, and in particular, relates to a dummy pixel circuit, a display panel, and a display device.

BACKGROUND

A plurality of gate lines and a plurality of data lines are arranged in a display region of a display panel. The plurality of gate lines and the plurality of data lines are intersected, such that a plurality of pixel regions are defined in the display region. The pixel region is provided with a pixel circuit that are electrically connected to a corresponding gate and data line.

SUMMARY

Embodiments of the present disclosure provide a dummy pixel circuit, a display panel, and a display device. The technical solutions are as follows:

According to some embodiments of the present disclosure, a dummy pixel circuit is provided, applicable to a display panel provided with two through vias. The dummy pixel circuit is disposed between the two through vias and includes: a pixel sub-circuit including one or more first transistors, wherein a control electrode of the first transistor is electrically connected to a first gate line, the first gate line being provided with a bend that bypasses the through via; and a dummy sub-circuit including one or more second transistors, wherein a control electrode of the second transistor is electrically connected to the first gate line, a first electrode of the second transistor is electrically connected to a first electrode of a corresponding one of the one or more first transistors, and a second electrode of the second transistor is electrically connected to a second electrode of the corresponding first transistor; wherein each of the one or more first transistors corresponds to at least one of the one or more second transistors.

In some embodiments of the present disclosure, the first transistor includes a first switch transistor and a first compensation transistor, and the second transistor includes a second switch transistor and a second compensation transistor; wherein the second switch transistor corresponds to the first switch transistor, and the second compensation transistor corresponds to the first compensation transistor.

In some embodiments of the present disclosure, orthographic projections of the first switch transistor and the first compensation transistor on a first surface are disposed between an orthographic projection of the first switch transistor on the first surface and an orthographic projection of the first compensation transistor on the first surface, wherein the first surface is a surface of a base substrate where the dummy pixel circuit is disposed.

In some embodiments of the present disclosure, orthographic projections of an active layer of the second switch transistor and an active layer of the first switch transistor on the first surface form a rectangular ring; and the orthographic projection of the active layer of the second switch transistor on the first surface form two connected sides of the rectangular ring, and the orthographic projection of the active layer of the first switch transistor form the other two sides of the rectangular ring.

In some embodiments of the present disclosure, an extension direction of one of the other two sides of the rectangular ring is consistent with an extension direction of the connection line in a source-drain layer; and one of the other two sides of the rectangular ring is at least partially overlapped with the orthographic projection, of the connection line in the source-drain layer, on the first surface.

In some embodiments of the present disclosure, control electrodes of the second compensation transistor and the first compensation transistor are respectively disposed on two sides of the first gate line to which the first switch transistor is connected.

In some embodiments of the present disclosure, a connection line between a center of the control electrode of the second compensation transistor and a center of the control electrode of the first compensation transistor is perpendicular to the first gate line.

In some embodiments of the present disclosure, the first transistor includes a first reset transistor and a second reset transistor, and the second transistor includes a third reset transistor and a fourth reset transistor: wherein the third reset transistor corresponds to the first reset transistor, and the fourth reset transistor corresponds to the second reset transistor.

In some embodiments of the present disclosure, a number of the second transistors ranges from 1 to 4.

In some embodiments of the present disclosure, the first electrode of the first transistor and the first electrode of a second transistor connected thereto are disposed in the same layer; and the second electrode of the first transistor and a second electrode of the second transistor connected thereto are in the same layer.

In some embodiments of the present disclosure, the first electrode of the first transistor and a first electrode of a corresponding one of the one or more second transistors are connected together by a trace, and the second electrode of the first transistor and a second electrode of the corresponding second transistor are connected together by a trace; and the first transistor and the second transistor share the same first electrode, and the first transistor and the second transistor share the same second electrode.

According to some embodiments of the present disclosure, a display panel is provided. The display panel includes the dummy pixel circuit and the first gate line according to any one of the aspects described above, and provided with two through vias therein, wherein the first gate line is provided with a bend that bypasses the through via, the dummy pixel circuit is disposed between the two through vias, and the control electrode of the second transistor is electrically connected to the first gate line.

In some embodiments of the present disclosure, the display panel further includes a pixel circuit and a second gate line, wherein a length of the first gate line is greater than a length of the second gate line; the pixel circuit and the pixel sub-circuit have an identical circuit structure, and the pixel circuit is electrically connected to the second gate line.

According to some embodiments of the present disclosure, a display device is provided, and the display device includes the display panel according to any one of the aspects described above.

BRIEF DESCRIPTION OF THE DRAWINGS

For clearer descriptions of the technical solutions in the embodiments of the present disclosure, accompanying drawings required for describing the embodiments are briefly introduced hereafter. Obviously, the accompanying drawings in the following description show merely some embodiments of the present disclosure, and a person of ordinary skill in the art may further derive other drawings from these accompanying drawings without creative efforts.

DETAILED DESCRIPTION

Figure 1:
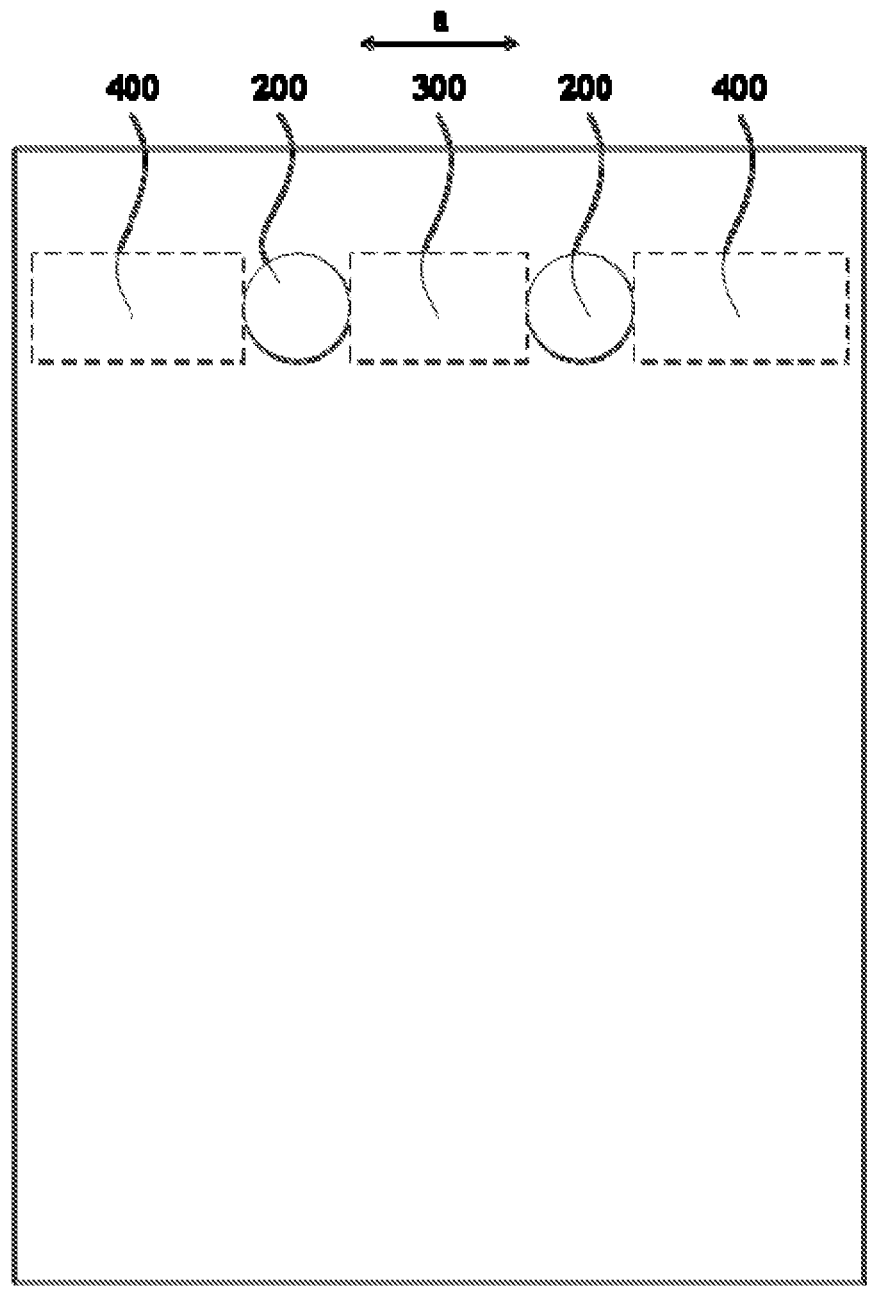
FIG. 1 is a top view of a display panel according to some embodiments of the present disclosure.

For clearer descriptions of the objectives, technical solutions and advantages of the present disclosure, the embodiments of the present disclosure are described in further detail hereinafter with reference to accompanying drawings.

Transistors in various embodiments of the present disclosure may be thin film transistors or field effect transistors or other devices with same characteristics. The transistors in the embodiments of the present disclosure are mainly switch transistors according to their functions in the circuit. A source electrode and a drain electrode of the switch transistor herein are symmetrical; and therefore, the source electrode and the drain electrode are interchangeable. In the embodiments of the present disclosure, the source electrode is referred to as a first electrode, and the drain electrode is referred to as a second electrode. According to the form in the drawings, the middle terminal of the transistor is a gate electrode, the signal input terminal of the transistor is a source electrode, and the signal output terminal of the transistor is a drain electrode. In addition, the switch transistor in the embodiments of the present disclosure may include any one of a P-type switch transistor, and an N-type switch transistor. The P-type switch transistor is turned on when the gate electrode is at a low level, and turned off when the gate electrode is at a high level. The N-type switch transistor is turned on when the gate electrode is at a high level, and turned off when the gate electrode is at a low level. In addition, a plurality of signals in the various embodiments of the present disclosure correspond to a first potential and a second potential. The first potential and the second potential only represent two state quantities of the potential of the signal, and do not represent the first potential or the second potential in embodiments of the present disclosure has a specific value.

In some display devices, for example, in a mobile terminal, a display panel, a front camera and an earpiece are all arranged on a front side of the mobile terminal. Two through vias are arranged on the display panel of the mobile terminal for placement of the front camera and the earpiece of the mobile phone.

The gate line and data line need to bypass the through vias for routing at the two through vias, such that the gate line and data line are formed with a bend at the through vias. The number of pixel circuits connected to the gate line with the bend is relatively less, and thus a total load of the pixel circuits, connected to the gate line with the bend, is decreased. In this way, a storage capacity of the capacitor of the pixel circuit connected to the gate line with the bend is increased, the output power of the capacitor to the control electrode of the drive transistor of the pixel circuit is increased, and the gate voltage is increased. A gate voltage of the drive transistor is less than a source voltage (Vs), such that the gate-source voltage (Vgs) of the drive transistor is less than 0. The current flowing through the drive transistor is positively correlated to the square of the gate-source voltage, such that the greater the gate-source voltage is, the less the absolute value of the gate-source voltage is, the less the current flowing through the drive transistor is, and thus the lower the luminance of the pixel is. In this way, the pixel, to which the pixel circuit connected to the gate line with the bent corresponds, has a lower luminance.

The region between the two through vias is provided with a dummy pixel circuit. The dummy pixel circuit is electrically connected to a gate line with a bend. A thin-film transistor (TFT) in the dummy pixel circuit has resistance, and the thin film transistor consumes part of power, such that the total load of the pixel circuits connected to the gate line with the bend is increased. In this way, the storage power of the capacitor is reduced, the amount of power output by the capacitor to the control electrode of the drive transistor is reduced, and the gate voltage of the control electrode of the drive transistor is decreased. Accordingly, the absolute value of the gate-source voltage becomes greater, and the current flowing through the drive transistor becomes greater, such that the pixel, to which the pixel circuit electrically connected to the gate line with the bend corresponds, has an increased luminance.

In some practices, the dummy pixel circuit and a normal pixel circuit have an identical circuit structure, and the dummy pixel circuit is different from the normal pixel circuit in that the pixel, where the dummy pixel circuit is disposed, has no pixel define layer, and thus the dummy pixel has no light-emitting layer. That is, the dummy pixel does not emit light. Due to the limited area between the two through vias, a limited number of dummy image circuits are arranged between the two through vias, the dummy pixel circuit has a limited reduced gate voltage, and the display panel still has display mura.

FIG. 1 is a top view of a display panel according to some embodiments of the present disclosure. Referring to FIG. 1, two through vias 200 are arranged in a display region of the display panel, and the two through vias 200 are arranged in a first direction a. An intermediate region 300 between the two through vias 200 is configured to arrange the dummy pixels. Other display regions in the display region other than the intermediate area 300 are provided with the normal pixels, such that the display panel is capable of displaying a picture.

Figure 2:
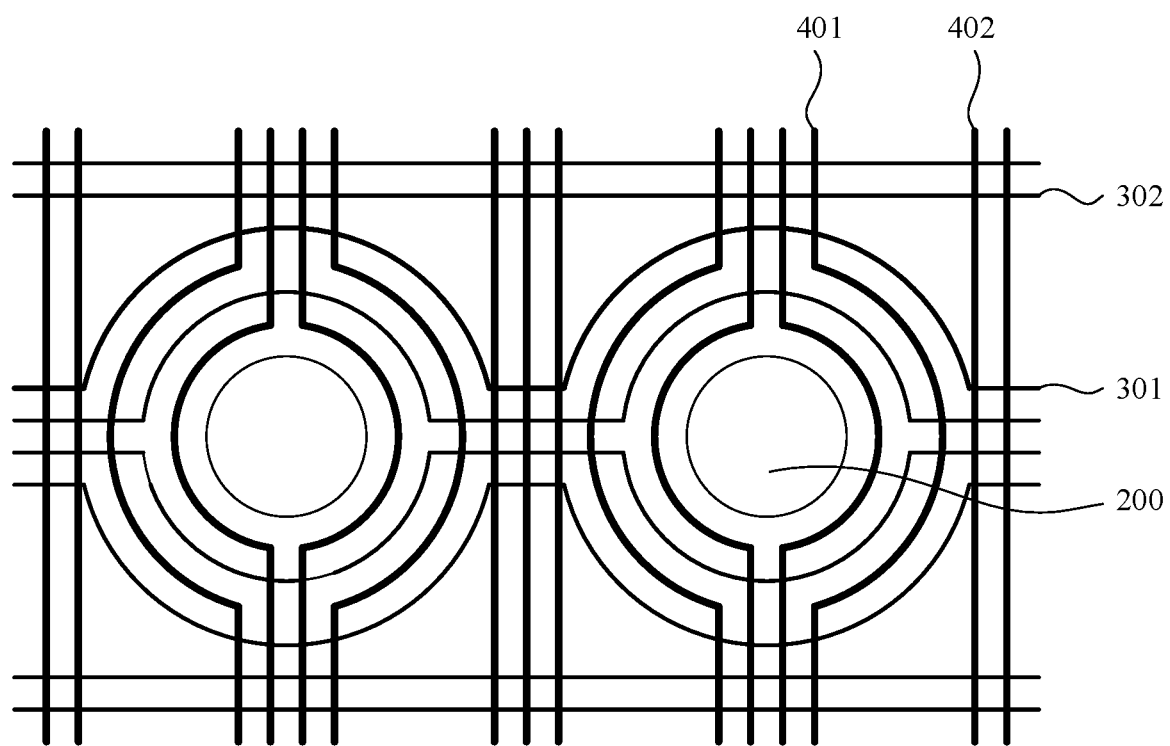
FIG. 2 is a structure diagram of a trace of a display substrate at a through via according to some embodiments of the present disclosure.

FIG. 2 is a structure diagram of a trace of a display substrate at a through via according to some embodiments of the present disclosure. Referring to FIG. 2, a display panel includes a plurality of gate lines and a plurality of data lines. The plurality of gate lines and the plurality of data lines are intersected with each other. As shown in FIG. 2, the plurality of gate lines include a plurality of first gate lines 301 and a plurality of second gate lines 302. The plurality of data lines include a plurality of first data lines 401 and a plurality of second data lines 402. The first gate line 301 and the first data line 401 bypass the through via 200 for routing at the through via 200, such that the first gate line 301 and the first data line 401 are formed with a bend at the through via 200. The second gate line 302 and the second data line 402 are distal from the through via, and thus do not need to bypass the through via 200 for routing. The first gate line 301 is the gate line with a bend described as above, and the second gate line 302 is a gate line without a bend.

The first gate line 301 and the second gate line 302 both extend along the first direction a, and thus pixels with lower luminances are also arranged along the first direction a. As shown in FIG. 1, the pixels with lower luminances are disposed in two edge regions 400, and the two through vias 200 are disposed between the two edge regions 400. The edge region 400 refers to a partial area proximal to an edge.

Figure 3:
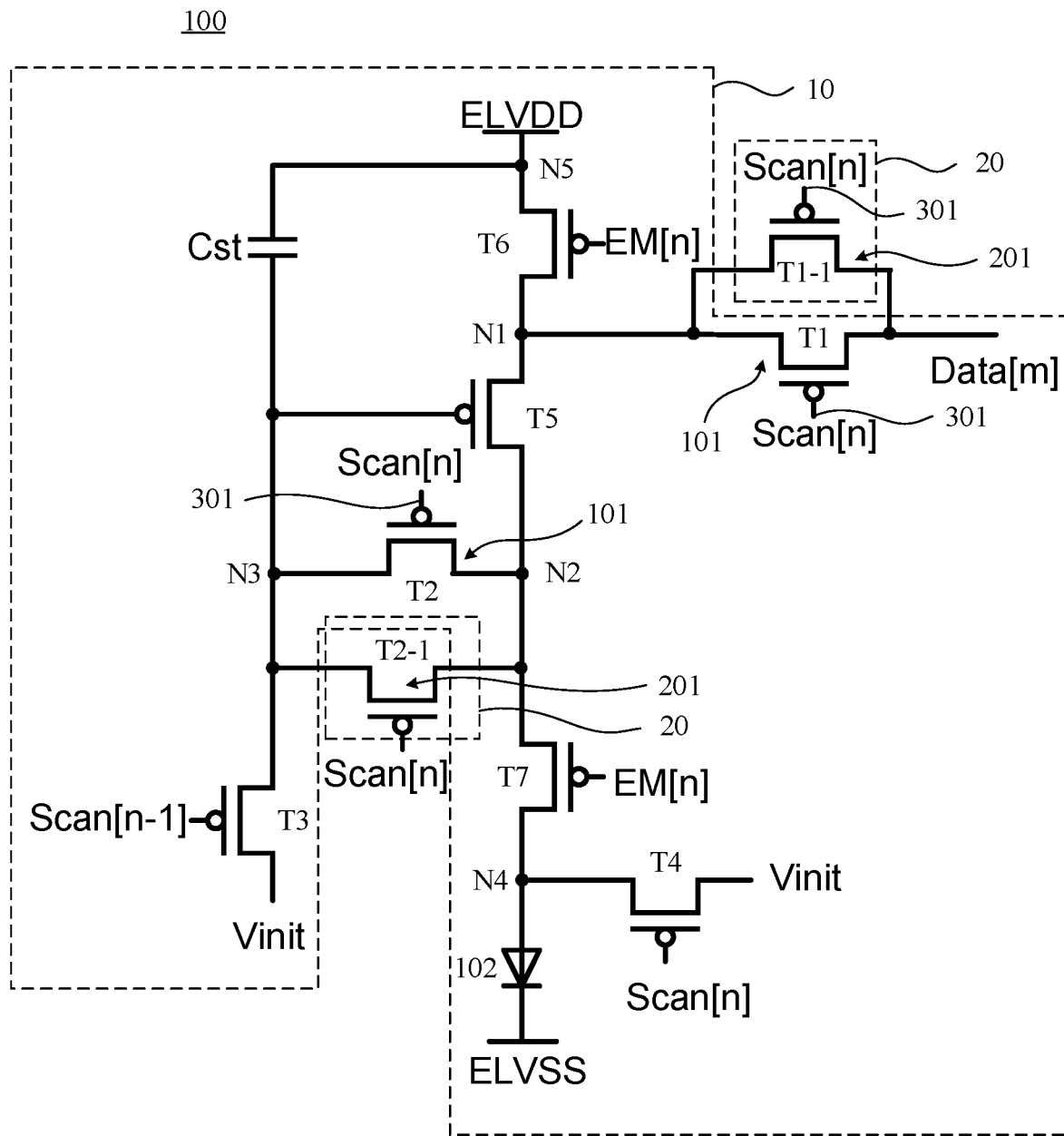
FIG. 3 is a circuit diagram of a dummy pixel circuit according to some embodiments of the present disclosure.

FIG. 3 is a circuit diagram of a dummy pixel circuit according to some embodiments of the present disclosure. Referring to FIG. 3, the dummy pixel circuit 100 includes a pixel sub-circuit 10 and a dummy sub-circuit 20. The pixel sub-circuit 10 includes one or more first transistors 101, wherein a control electrode of the first transistor 101 is electrically connected to the first gate line 301. The dummy sub-circuit 20 includes one or more second transistors 201, wherein a control electrode of the dummy sub-circuit 20 is electrically connected to the first gate line 301, a first electrode of the second transistor 201 is electrically connected to a first electrode of a corresponding one of the one or more first transistors 101, and a second electrode of the second transistor 201 is electrically connected to a second electrode of the corresponding first transistor 101. Each of the one or more first transistors 101 corresponds to at least one of the one or more second transistors 201. The expression "the second transistor 201 corresponds to the first transistor 101" means that the second transistor 201 is connected in parallel to the first transistor 101, the first electrodes of the two transistors connected in parallel are connected, and the second electrodes of the two transistors connected in parallel are connected. The expression "Each of the one or more first transistors 101 corresponds to at least one of the one or more second transistors 201" means that a first electrode of each of the one or more first transistors 101 corresponds to a first electrode or first electrodes of one, two or more second transistors 201, and a second electrode of each of the one or more one first transistors 101 corresponds to a second electrode or second electrodes of one, two or more second transistors 201. The dummy pixel circuit 100 according to the embodiments of the present disclosure is disposed between two through vias 200 of a display panel, and the first gate line 301 is provided with a bend that by passes the through via 200.

In some embodiments of the present disclosure, the structure of the pixel sub-circuit 10 is identical to the structure of the pixel circuits in other display regions. For example, the pixel sub-circuit 10 is a 2T1C (i.e., two TFTs and one capacitor) circuit in the case that the pixel circuit of the other display regions is a 2T1C circuit: and the pixel sub-circuit 10 is a 7T1C (i.e., seven TFTs and one capacitor) circuit in the case that the pixel circuit of the other display regions is a 7T1C circuit. The dummy pixel circuit according to the embodiments of the present disclosure is described below by taking the pixel sub-circuit as a 7T1C circuit as an example.

The second transistor 201 is added into the dummy pixel circuit 100, and the control electrode of the second transistor 201 is also electrically connected to the first gate line 301, such that the second transistor 201 also consumes power transmitted by the first gate line 301. In this way, during the operation of the display panel, a total load of the pixel circuit electrically connected to the first gate line 301 is increased, the amount of power delivered by the first gate line 301 to the capacitor of each pixel circuit is decreased, a storage capacity of the capacitor of the pixel circuit electrically connected to the first gate line 301 is reduced, an amount of output power is decreased, and the gate voltage is decreased. As a result, the pixel, to which the pixel circuit electrically connected to the first gate line corresponds, has an increased luminance, thereby mitigating display mura of display panel.

In addition, not only resistance of the transistor consumes power, but also an interelectrode capacitance, formed between the control electrode and the first and second electrodes of the transistor, consumes power. The first electrode of the second transistor 201 is connected to the first electrode of the first transistor 101, and the second electrode of the second transistor 201 is connected to the second electrode of the first transistor 101. In this way, an interelectrode capacitance of the second transistor 201 is equal to an interelectrode capacitance of the first transistor 101, and an amount of power consumed by the interelectrode capacitance of the second transistor 201 is equal to an amount of power consumed by the interelectrode capacitance of the first transistor 101. That is, the interelectrode capacitance of the second transistor 201 is an active capacitance. In this way, in the case that gray scale of the display panel is changed, the amount of power consumed by the interelectrode capacitance of the second transistor also changes with the gray scale of the display panel. That is, at different gray scales, the interelectrode capacitance of the second transistor consumes different amounts of power, and thus the pixel has different luminances. In other cases, the amounts of power consumed by the interelectrode capacitance of the second transistor at different gray scales are equal, which causes a large difference between the luminance of the pixel connected to the first gate line and luminances of other pixels. Therefore, display mura of display panel is further mitigated.

In some embodiments of the present disclosure, the first transistor 101 and the second transistor 201 are both thin film transistors. The control electrode of the first transistor 101 is as a gate electrode of the first transistor 101, one of the first electrode and second electrode of the first transistor 101 is a source electrode, and the other is a drain electrode. The control electrode of the second transistor 201 is a gate electrode of the second transistor 201, one of the first electrode and the second electrode of the second transistor 201 is a source electrode, and the other is a drain electrode.

Figure 4:
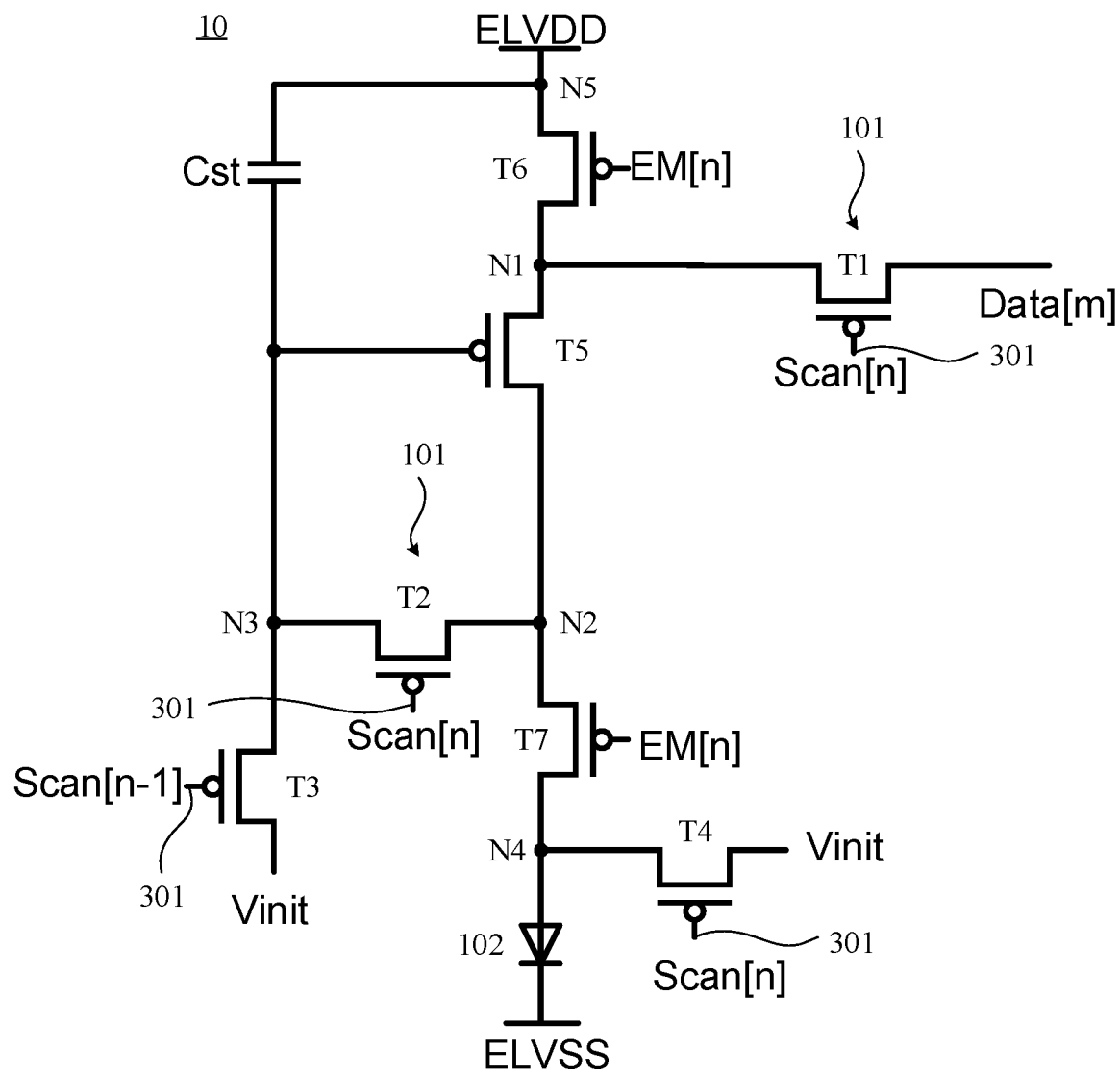
FIG. 4 is a circuit diagram of a 7T1C circuit according to some embodiments of the present disclosure.

FIG. 4 is a circuit diagram of a 7T1C circuit according to some embodiments of the present disclosure. Referring to FIG. 4, the pixel sub-circuit 10 includes a first switch transistor T1, a first compensation transistor T2, a first reset transistor T3, a second reset transistor T4, a drive transistor T5, a first light-emitting control transistor T6, a second light-emitting control transistor T7, and a capacitor Cst.

The control electrode of the first switch transistor T1 is electrically connected to one of the first gate lines 301 by a first scan signal terminal (Scan [n]), the first electrode of the first switch transistor T1 is electrically connected to one data line by the data input terminal (Data [m]), and the second electrode of the first switch transistor T1 is electrically connected to a first node N1.

A control electrode of the first compensation transistor T2 is electrically connected to one of the first gate lines 301 by the first scan signal terminal (Scan [n]), a first electrode of the first compensation transistor T2 is electrically connected to a second node N2, and a second electrode of the first compensation transistor T2 is electrically connected to a third node N3.

A control electrode of the first reset transistor T3 is electrically connected to another first gate line 301 by a second scan signal terminal (Scan [n−1]), a first electrode of the first reset transistor T3 is electrically connected to an initial voltage signal line by an initialization voltage terminal (Vinit), and a second electrode of the first reset transistor T3 is electrically connected to the third node N3.

A control electrode of the second reset transistor T4 is electrically connected to one of the first gate lines 301 by the first scan signal terminal (Scan [n]), a first electrode of the second reset transistor T4 is electrically connected to the initial voltage signal line by the initialization voltage terminal (Vinit), and a second electrode of the second reset transistor T4 is electrically connected to a fourth node N4.

A control electrode of the drive transistor T5 is electrically connected to the third node N3, a first source electrode of the drive transistor T5 is electrically connected to the first node N1, and a second source electrode of the drive transistor T5 is electrically connected to the second node N2.

A control electrode of the first light-emitting control transistor T6 is electrically connected to a light-emitting control signal terminal (EM [n]), a first electrode of the first light-emitting control transistor T6 is electrically connected to the first node N1, a second electrode of the first light-emitting control transistor T6 is electrically connected to a fifth node N5, and the fifth node N5 is electrically connected to a second voltage signal terminal (ELVDD).

A control electrode of the second light-emitting control transistor T7 is electrically connected to the light-emitting control signal terminal (EM [n]), a first electrode of the second light-emitting control transistor T7 is electrically connected to the second node N2, and a second electrode of the second light-emitting control transistor T7 is electrically connected to a fourth node N4.

A first plate of the capacitor Cst is electrically connected to the fifth node N5, and a second plate of the capacitor Cst is electrically connected to the third node N3.

Referring to FIG. 4 again, the pixel sub-circuit further includes a light-emitting diode (LED) 102. The fourth node N4 is electrically connected to a terminal of the light-emitting diode 102, and a terminal of the light-emitting diode 102 is electrically connected to a first voltage signal terminal (ELVSS).

In some embodiments of the present disclosure, the number of second transistors 201 in the dummy sub-circuit 20 ranges from 1 to 4. For example, the dummy sub-circuit 20 includes two second transistors 201, the pixel sub-circuit 10 includes two first transistors 101, and one of the second transistors 201 corresponds to one of the first transistors 101.

An intermediate region 300 between the two through vias 200 has a limited space. Therefore, a volume of the pixel sub-circuit 10 is too large in the case that the number of the second transistors 201 is great, which is inconvenient to manufacture.

Referring to FIG. 3 again, the first transistor 101 includes a first switch transistor T1 and a first compensation transistor T2, and the second transistor 201 includes a second switch transistor T1-1 and a second compensation transistor T2-1.

The second switch transistor T1-1 corresponds to the first switch transistor T1, and the second compensation transistor T2-1 corresponds to the first compensation transistor T2. In this way, the first electrode of the second switch transistor T1-1 is electrically connected to the first electrode of the first switch transistor T1, and the second electrode of the second switch transistor T1-1 is electrically connected to the second electrode of the first switch transistor T1. The first electrode of the second compensation transistor T2-1 is electrically connected to the first electrode of the first compensation transistor T2, and the second electrode of the second compensation transistor T2-1 is electrically connected to the second electrode of the first compensation transistor T2.

As described above, in the case that the control electrode of the first switch transistor T1 and the control electrode of the first compensation transistor T2 are both electrically connected to the first gate line 301, the first gate line 301 must pass through the first switch transistor T1 and the first compensation transistor T2. The first electrode of the second switch transistor T1-1 is electrically connected to the first electrode of the first switch transistor T1, and the second electrode of the second switch transistor T1-1 is electrically connected to the second electrode of the first switch transistor T1, such that the second switch transistor T1-1 is disposed in the vicinity of the first switch transistor T1. The first electrode of the second compensation transistor T2-1 is electrically connected to the first electrode of the first compensation transistor T2, and the second electrode of the second compensation transistor T2-1 is electrically connected to the second electrode of the first compensation transistor T2, such that the second compensation transistor T2-1 is disposed in the vicinity of the first compensation transistor T2. That is, the second switch transistor T1-1 and the second compensation transistor T2-1 are both disposed in the vicinity of the first gate line 301, which facilitates to electrically connect the control electrode of the second switch transistor T1-1 and the control electrode of the second compensation transistor T2-1 to the first gate line 301.

Figure 5:
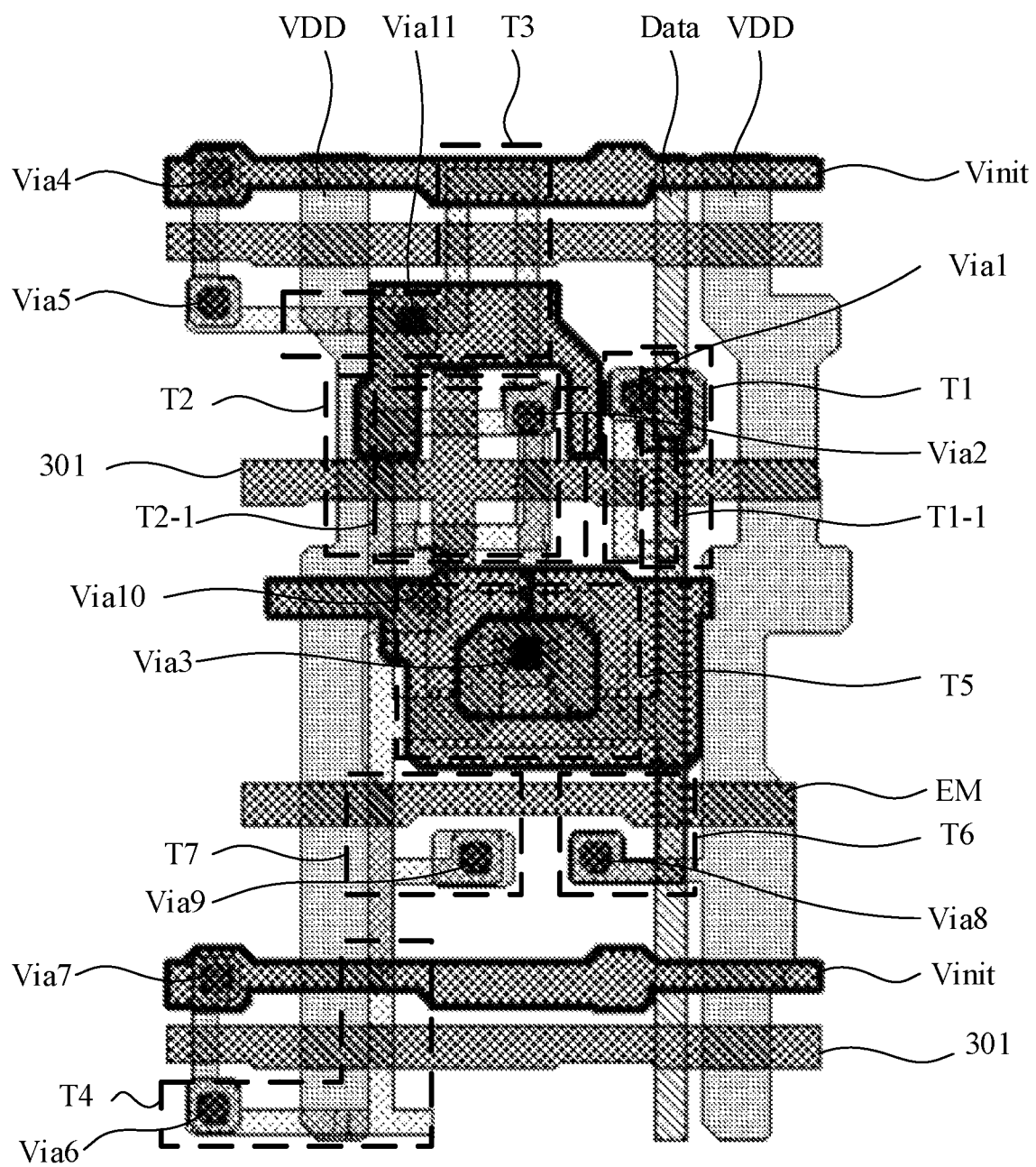
FIG. 5 is a film layer diagram of a dummy pixel circuit according to some embodiments of the present disclosure.

FIG. 5 is a film layer diagram of a dummy pixel circuit according to some embodiments of the present disclosure. Referring to FIG. 5, orthographic projections of two transistors (i.e., the second switch transistor T1-1 and the second compensation transistor T2-1) on a first surface are between an orthographic projection of the first switch transistor T1 on the first surface and an orthographic projection of the first compensation transistor T2 on the first surface, wherein the first surface is a surface of a base substrate where the dummy pixel circuit is disposed. Herein, the expression "the orthographic projections of the second switch transistor T1-1 and the second compensation transistor T2-1 are between the orthographic projection of the first switch transistor T1 and the orthographic projection of the first compensation transistor T2" means that the orthographic projections of the second switch transistor T1-1 and the second compensation transistor T2-1 are between a side, distal from the orthographic projection of the first compensation transistor T2, of the orthographic projection of the first switch transistor T1 and a side, distal from the orthographic projection of the first switch transistor T1, of the orthographic projection of the first compensation transistor T2. The second switch transistor T1-1 and the second compensation transistor T2-1 are disposed between the first switch transistor T1 and the first compensation transistor T2. The orthographic projections of the second switch transistor T1-1 and the second compensation transistor T2-1 on the first surface are ensured to be in a region enclosed by an outer contour of the orthographic projection of the pixel sub-circuit 10 on the first surface. In this way, the dummy pixel circuit 100 is disposed between the two through vias 200.

Figure 6:
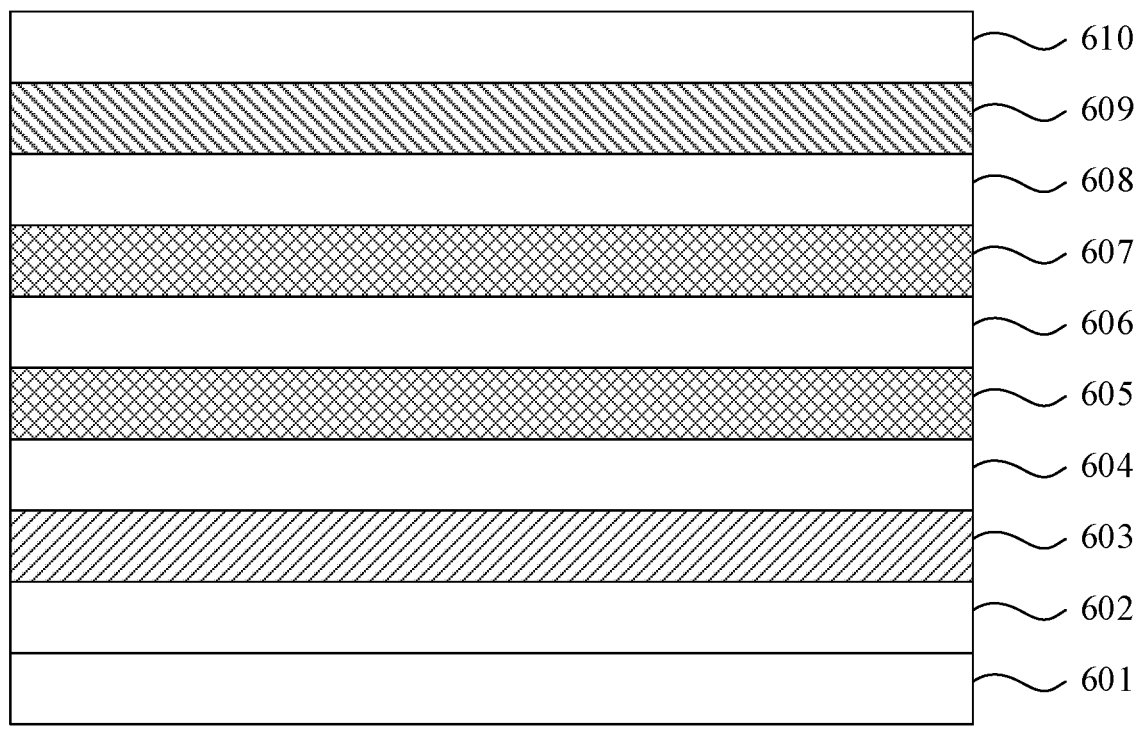
FIG. 6 is a film layer diagram of an array substrate where a dummy pixel is provided according to some embodiments of the present disclosure.

FIG. 6 is a film layer diagram of an array substrate where a dummy pixel is provided according to some embodiments of the present disclosure. Referring to FIG. 6, the array substrate includes a base substrate 601, a buffer layer 602, an active layer 603, a first gate insulative layer 604, a first gate layer 605, a second gate insulative layer 606, a second gate layer 607, an interlayer dielectric 608, a source-drain layer 609, and a planarization layer 610 laminated sequentially.

In some embodiments of the present disclosure, the control electrode of the first transistor 101 and the control electrode of the second transistor 201 are both disposed in the first gate layer 605. The second gate insulative layer 606 is spaced between the first gate layer 605 and the second gate layer 607, and an interelectrode capacitance is generated between the control electrode of the first transistor 101 and the second gate layer 607. The second gate insulative layer 606, the second gate layer 607, and the interlayer dielectric 608 are spaced between the first gate layer 605 and the source-drain layer 609, an interelectrode capacitance is generated between the control electrode of the first transistor 101 and the source-drain layer 609. A first gate insulative layer 604 is spaced between the first gate layer 605 and the active layer 603, such that an interelectrode capacitance is also generated between the control electrode of the first transistor 101 and the active layer 603.

In other embodiments, the display panel includes only one gate layer and one gate insulative layer.

In other examples, the display panel includes two source-drain layers, and an insulative layer is disposed between the two source-drain layers.

In some embodiments, the base substrate 601 is a glass substrate or a plastic substrate to ensure light transmission of the base substrate.

In some embodiments, the buffer layer 602 is an inorganic insulative layer, such as a silicon nitride (SiN) layer or a silicon oxynitride (SiON) layer, or an organic insulative layer, such as an epoxy resin insulative layer. Silicon nitride and epoxy resin have good insulation properties, which ensures the insulation of buffer layer 602.

In some embodiments, the active layer 603 is a low temperature polysilicon layer or an indium gallium zinc oxide semiconductor layer. In some embodiments, the first gate insulative layer 604 and the second gate insulative layer 606 is silicon nitride, silicon oxynitride, or an epoxy resin insulative layer. In some embodiments, the first gate layer 605 and the second gate layer 607 is an indium tin oxide layer or a metal layer, such as a copper (Cu) layer. In some embodiments, the interlayer dielectric 608 is silicon nitride, silicon oxynitride, or an epoxy resin insulative layer.

In some embodiments, the source-drain layer 609 is an indium tin oxide layer or a metal layer. In some embodiments, the planarization layer 610 is silicon nitride, silicon oxynitride, or an epoxy resin insulative layer.

In some embodiments of the present disclosure, the first electrode of the first transistor 101 and the first electrode of the second transistor 201 connected thereto are in the same layer, and the second electrode of the first transistor 101 and the second electrode of the second transistor 201 connected thereto are in the same layer.

The first electrode of the first transistor 101 and the first electrode of the second transistor 201 are arranged in the same layer, and the second electrode of the first transistor 101 and the second electrode of the second transistor 201 are arranged in the same layer. In this way, electrical connection of the first electrode of the first transistor 101 and the first electrode of the second transistor 201, and electrical connection of the second electrode of the first transistor 101 and the second electrode of the second transistor 201 are facilitated.

In some embodiments of the present disclosure, the first electrode of the first transistor 101, the first electrode of the second transistor 201, the second electrode of the first transistor 101, and the second electrode of the second transistor 201 are disposed in the active layer 603. The first electrode of the first transistor 101, the first electrode of the second transistor 201, the second electrode of the first transistor 101, and the second electrode of the second transistor 201 are metallized active layer 603.

In some embodiments of the present disclosure, the first electrode of the first transistor 101, the first electrode of the second transistor 201, the second electrode of the first transistor 101, and the second electrode of the second transistor 201 are disposed in the source-drain layer 609.

In some embodiments, the expression "the first electrode of the first transistor 101 and the first electrode of the second transistor 201 connected thereto are in the same layer" means that the first electrode of the first transistor 101 and is the first electrode of the second transistor 201 connected thereto are manufactured using the same patterning process. Similarly, the second electrode of the first transistor 101 and the second electrode of the second transistor 201 connected thereto are manufactured using the same patterning process.

In some embodiments of the present disclosure, the first transistor 101 and the second transistor 201 share the same first electrode, and the first transistor 101 and the second transistor 201 share the same second electrode.

In some embodiments of the present disclosure, using a common electrode, in one aspect, reduces manufacturing difficulty, and on the other hand, reduces space occupied by the second transistor 201, which ensures that the dummy pixel circuit 100 is arranged between the two through vias 200.

In some embodiments of the present disclosure, the first electrode of the first transistor 101 is connected to the first electrode of the second transistor 201 by a trace, and the second electrode of the first transistor 101 is connected to the second electrode of the second transistor 201 by a trace.

In some embodiments, in the case that the first transistor 101 and the second transistor 201 do not share the same first electrode, the first electrode of the first transistor 101 and the first electrode of the second transistor 201 are electrically connected by a trace, and thus the active layer 603 includes the first electrode of the first transistor 101, the first electrode of the second transistor 201, and the trace. Similarly, in the case that the first transistor 101 and the second transistor 201 do not share the same second electrode, the second electrode of the first transistor 101 and the second electrode of the second transistor 201 are electrically connected by a trace, and thus the active layer 603 includes the second electrode of the first transistor 101, the second electrode of the second transistor 201, and the trace.

Figure 7:
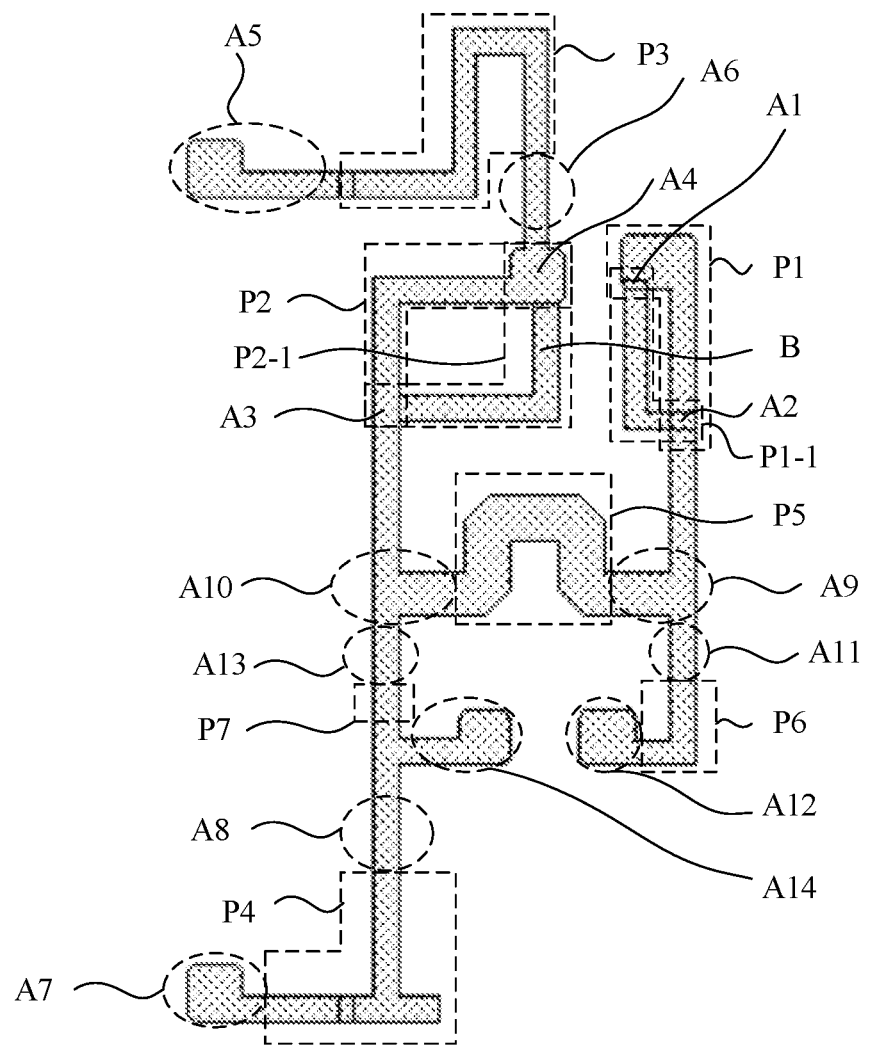
FIG. 7 is a film layer diagram of an active layer in FIG. 5 according to some embodiments of the present disclosure.

FIG. 7 is a film layer diagram of the active layer in FIG. 5 according to some embodiments of the present disclosure. Referring to FIG. 7, P1 in FIG. 7 represents the active layer of the first switch transistor T1, and P1-1 in FIG. 7 represents the active layer of the second switch transistor T1-1. Orthographic projections of an active layer P1-1 of the second switch transistor T1-1 and an active layer P1 of the first switch transistor T1 on the first surface form a rectangular ring. The orthographic projection of the active layer P1-1 of the second switch transistor T1-1 from two adjacent sides of the rectangular ring (corresponding to two sides on the left side and lower side in FIG. 7), and the orthographic projection of the active layer P1 of the first switch transistor T1 from the other two sides of the rectangular ring (corresponding to two sides on the right side and upper side in FIG. 7).

Referring to FIGS. 5 and 7, the first electrode A1 and the second electrode A2 of the first switch transistor T1 are both disposed in the active layer 603, and are metallized active layers. The first switch transistor T1 and the second switch transistor T1-1 share the same first electrode A1, and the first switch transistor T1 and the second switch transistor T1-1 share the same second electrode A2. The active layer P1-1 of the second switch transistor T1-1 and the active layer P1 of the first switch transistor T1 are both in an "L" shape, and the rectangular ring formed by the two "L" shaped active layers has two overlap parts. The first electrode A1 of the first switch transistor T1 and the second switch transistor T1-1 is one of the two overlap parts, and the second electrode A2 of the first switch transistor T1 and the second switch transistor T1-1 is the other of the two overlap parts.

Similarly, P2 in FIG. 7 refers to the active layer of the first compensation transistor T2, and P2-1 in FIG. 7 refers to the active layer of the second compensation transistor T2-1. orthographic projections of the active layer P2-1 of the second compensation transistor T2-1 the active layer P2 of the first compensation transistor T2 on the first surface form a rectangular ring. The orthographic projection of the active layer P2-1 of the second compensation transistor T2-1 from two adjacent sides of the rectangular ring, and the orthographic projection of the active layer P2 of the first compensation transistor T2 from the other two sides of the rectangular ring.

Referring to FIGS. 5 and 7, a first electrode A3 and a second electrode A4 of the first compensation transistor T2 are both disposed in the active layer 603, and are metallized active layers. Moreover, the first compensation transistor T2 and the second compensation transistor T2-1 share the same first electrode A3, and the first compensation transistor T2 and the second compensation transistor T2-1 share the same second electrode A4. The active layer P2-1 of the second compensation transistor T2-1 and the active layer P2 of the first compensation transistor T2 are both in an "L" shape, and the rectangular ring formed by the two "L" shaped active layers has two overlap parts. The first electrode A3 of the first compensation transistor T2 and the second compensation transistor T2-1 is one of the two overlap parts, and the second electrode A4 of the first compensation transistor T2 and the second compensation transistor T2-1 is the other of the two overlap parts of the active layer P2-1 of the second compensation transistor T2-1 and the active layer P2 of the first compensation transistor T2.

In some embodiments of the present disclosure, in the rectangular ring formed by the orthographic projection of the active layer P2-1 of the second compensation transistor T2-1 and the orthographic projection of the active layer P2 of the first compensation transistor T2, an extension direction of one side B of two sides, of the active layer P2-1, corresponding to the second compensation transistor T2-1, is consistent with an extension direction of a connection line C (shown in FIG. 10) disposed in the source-drain layer, and the side B is at least partially overlapped with an orthographic projection of the connection line C in the source-drain layer on the first surface. That is, the active layer P2-1 of the second compensation transistor T2-1 has a side directly disposed below the connection line of the source-drain layer, which reduces the effect of the active layer P2-1 of the second compensation transistor T2-1 on aperture ratio of the display panel. The expression "the side B is at least partially overlapped with an orthographic projection of the connection line C in the source-drain layer on the first surface" means that the side B has an overlap part with the orthographic projection of the connection line C in the source-drain layer at the first surface.

P3 in FIG. 7 represents the active layer of the first reset transistor T3, P4 in FIG. 7 represents the active layer of the second reset transistor T4, P5 in FIG. 7 represents the active layer of the drive transistor T5, P6 in FIG. 7 represents the active layer of the first light-emitting control transistor T6, and P7 in FIG. 7 represents the active layer of the second light-emitting control transistor T7.

Figure 8:
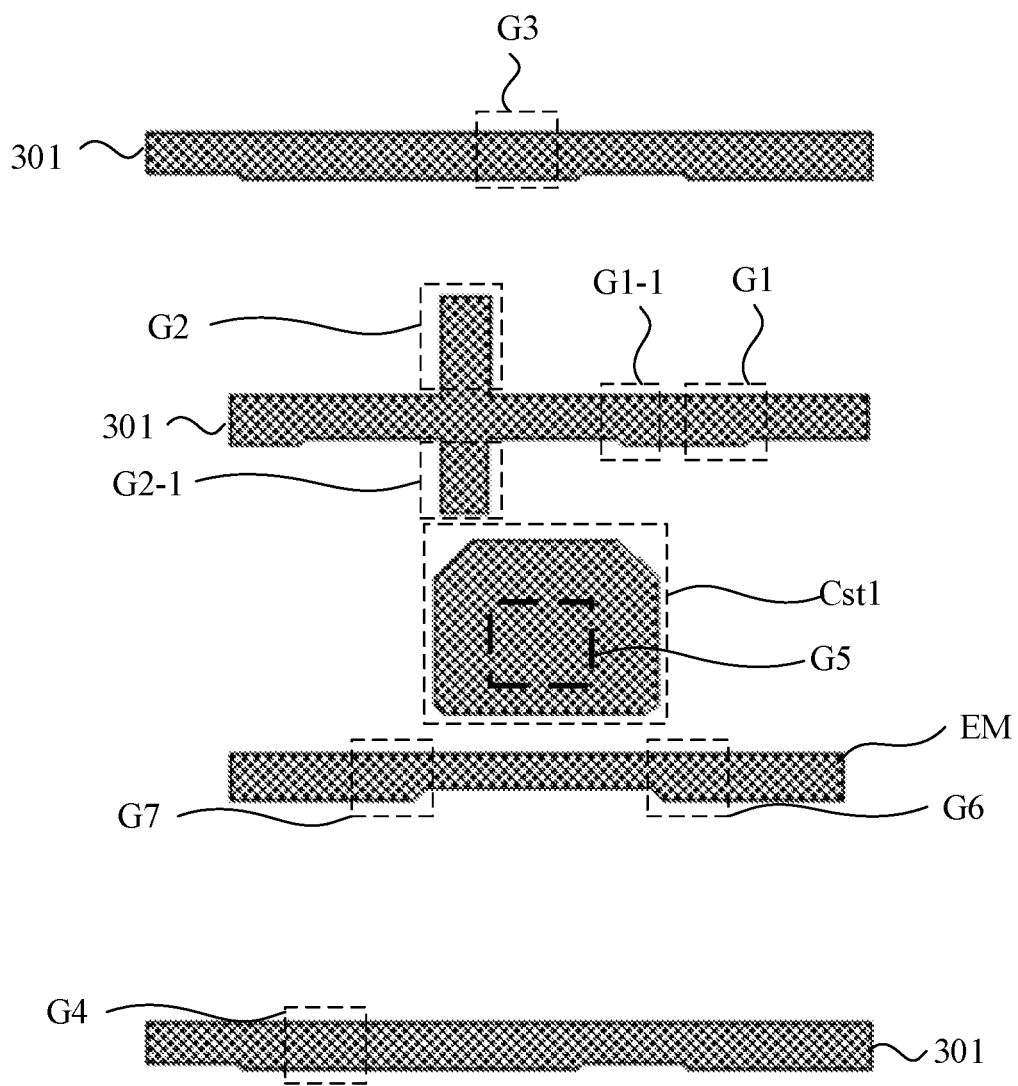
FIG. 8 is a film layer diagram of a first gate layer in FIG. 5 according to some embodiments of the present disclosure.

FIG. 8 is a film layer diagram of the first gate layer in FIG. 5 according to some embodiments of the present disclosure. Referring to FIG. 8, a control electrode G2-1 of the second compensation transistor T2-1 and a control electrode G2 of the first compensation transistor T2 are disposed on both sides of the first gate line 301 to which the first compensation transistor T2 is connected. As shown in FIG. 8, a middle part of the first gate line 301 has two protrusions, and the two protrusions together serve as the control electrode G2 of the first compensation transistor T2, and also serve as the control electrode G2-1 of the second compensation transistor T2-1. That is, the control electrode of the first compensation transistor T2 the control electrode G2-1 of the second compensation transistor T2-1 share a common electrode. In some practices, the second compensation transistor T2-1 is not present, such that only one of the protrusions G2 and G2-1 is present. The control electrode G1 of the first switch transistor T1 and the control electrode G1-1 of the second switch transistor T1-1 share a part of the first gate line 301. The control gate G3 of the first reset transistor T3 is a part of another first gate line 301. The control gate G4 of the second reset transistor T4 is a part of yet another first gate line 301. The control gate G5 of the drive transistor T5 is a part of the first capacitor plate Cst1. The control electrode G6 of the first light-emitting control transistor T6 and the control electrode G7 of the second light-emitting control transistor T7 are both a part of an EM signal line. The first gate line 301 connected to the first switch transistor T1 and the first gate line 301 connected to the second reset transistor T4 output one same scan signal, and extensions of the two first gate lines 301 are electrically connected, which is not shown in FIG. 8.

Referring to FIG. 8 again, on the first surface, a connection line between a center of the gate G2-1 of the second compensation transistor T2-1 and a center of the gate G2 of the first compensation transistor T2 is perpendicular to first gate line 301 connected thereto.

In some embodiments of the present disclosure, the first gate layer further includes a second gate line, a first signal line, and a second signal line. In a 7T1C circuit, it is desirable to provide a voltage signal such as RESET, REF, and VINT, in addition to GATE, VDD, DATA, and EM, and the first signal line and second signal line is configured to provide at least one of the voltage signals described above. For example, the first signal line is a RESET signal line, and the second signal line is an EM signal line. FIG. 8 is a film layer diagram of a first gate layer in a region, opposite to the dummy pixel circuit, of the first gate layer, wherein only a part of the first gate line 301 is shown, and a second gate line, a first signal line, and a second signal line are not shown.

Figure 9:
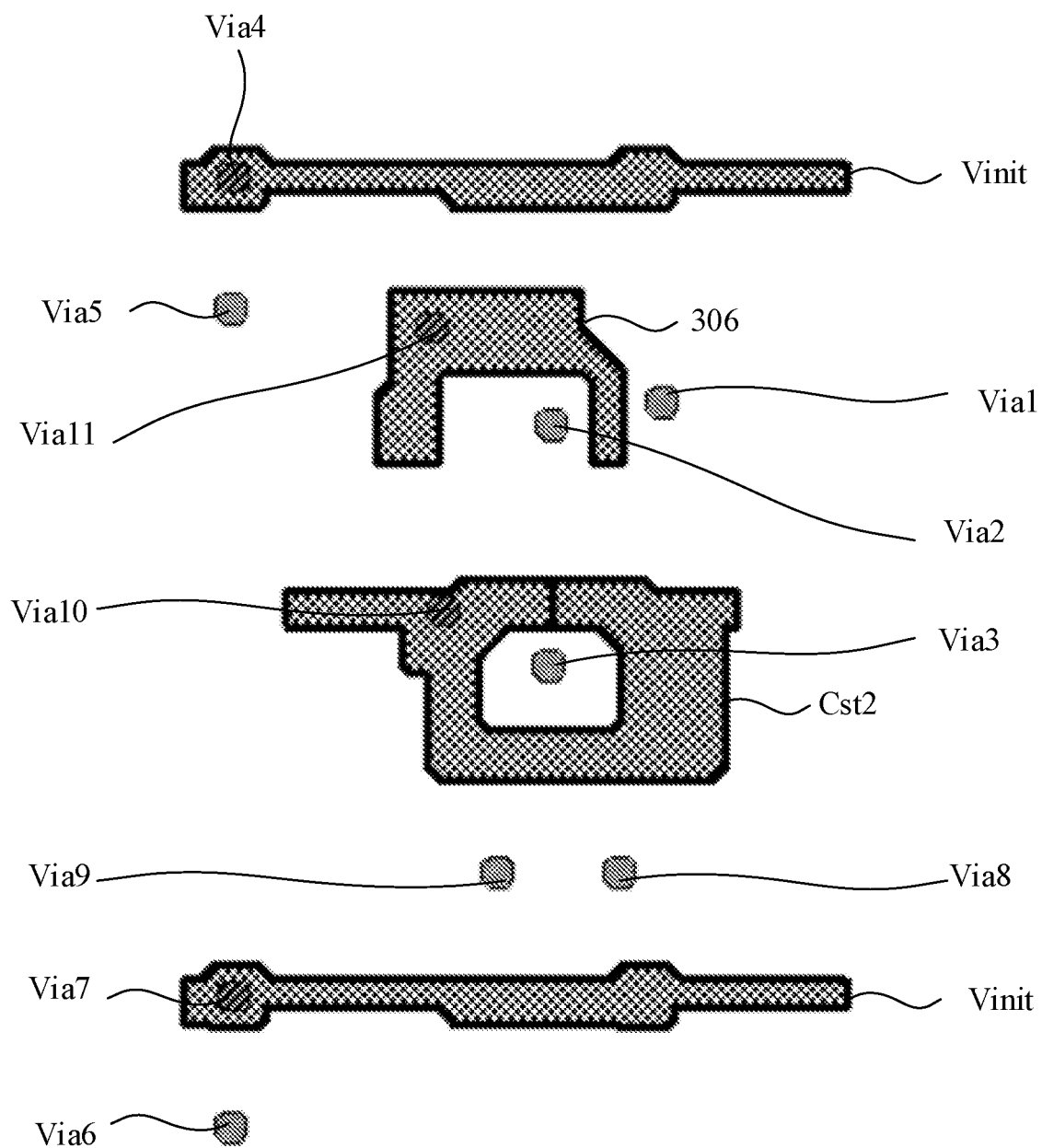
FIG. 9 is a positional relationship diagram of a second gate layer and vias in FIG. 5 according to some embodiments of the present disclosure.

FIG. 9 is a positional relationship diagram of a second gate layer and vias in FIG. 5 according to some embodiments of the present disclosure. In FIG. 9, the vias includes a first via Via 1 to an eleventh via Via 11, wherein Via 1, Via 2, Via 4, Via 6, and Via 8 are disposed in the first gate insulative layer 604, the second gate insulative layer 606, and the interlayer dielectric 608, Via 3 is disposed in the second gate insulative layer 606 and the interlayer dielectric 608, Via 5, Via 7, Via 10, and Via 11 are disposed in the interlayer dielectric 608, and Via 9 is disposed in the first gate insulative layer 604, the second gate insulative layer 606, the interlayer dielectric 608, and the planarization layer 610. Referring to FIG. 9, the second gate layer includes a Vinit signal line, a second capacitor plate Cst2, and a shielding layer 306. The first capacitor plate Cst1 and the second capacitor plate Cst2 form a storage capacitor, and in some embodiments, a storage capacitor is the capacitor Cst in a 7T1C circuit or the like. The shielding layer 306 is configured to shield the active layer, so as to prevent current leakage, and form a capacitance with the active layer. The capacitance is configured to stabilize the voltage of a thin film transistor in the 7T1C circuit. The Vinit signal line is configured to provide a VINT voltage signal. Only a part of the Vinit signal line is shown in FIG. 9.

Figure 10:
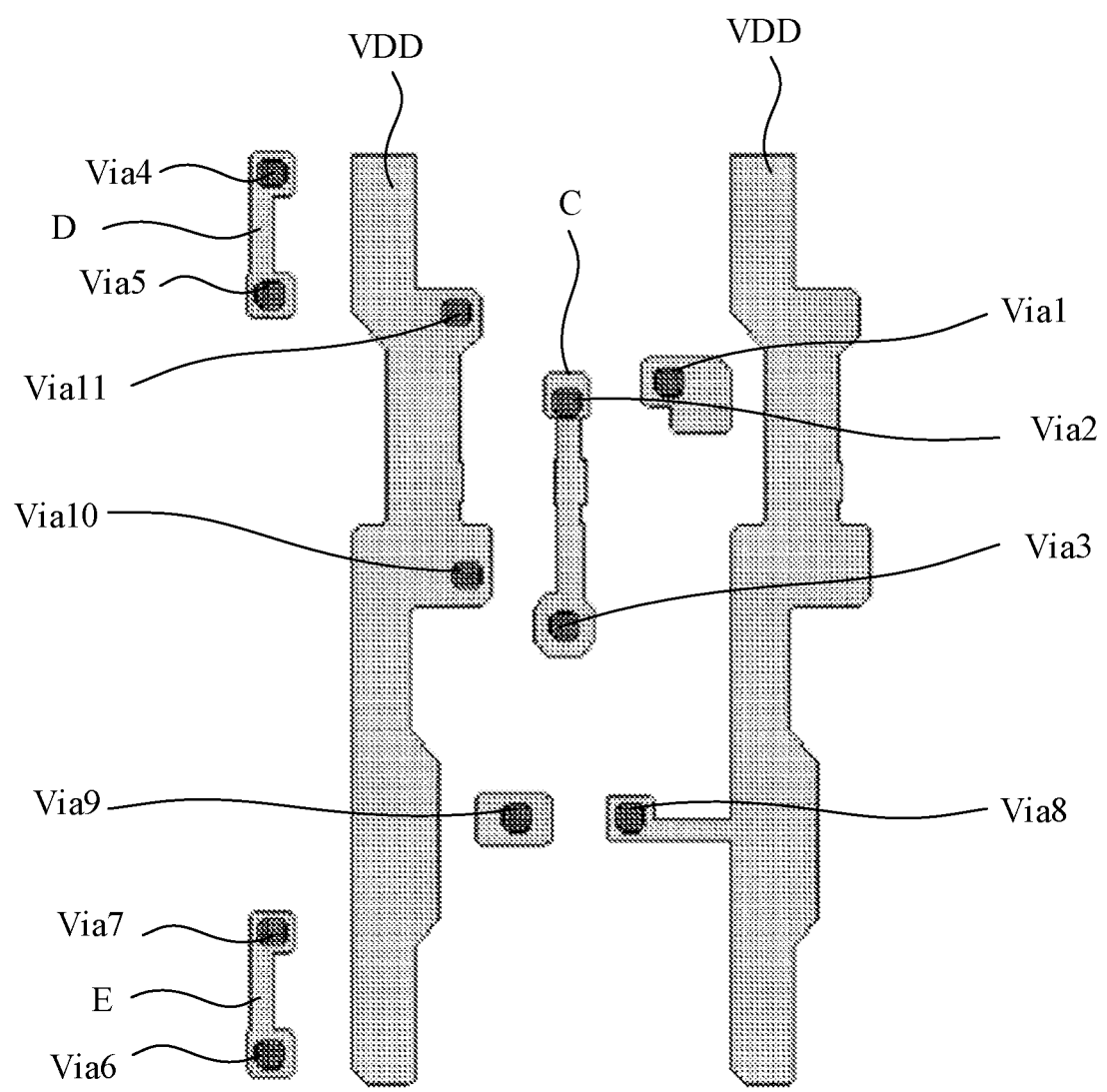
FIG. 10 is a positional relationship diagram of a source-drain layer and vias in FIG. 5 according to some embodiments of the present disclosure.

FIG. 10 is a positional relationship diagram of a source-drain layer and vias in FIG. 5 according to some embodiments of the present disclosure. Referring to FIG. 10, a VDD signal line is arranged in the source-drain layer. The first electrode of the first compensation transistor T2 (i.e., A3 in FIG. 7) and the second electrode (i.e., A10) of the drive transistor T5 are electrically connected by the connection line C of the source-drain layer.

Referring to FIGS. 10, 9, 7, and 5, the first electrode A1 of the first switch transistor T1 is electrically connected to the Data signal line by the first via Via 1, and the second electrode A2 of the first switch transistor T1 is electrically connected to a first electrode A9 of the drive transistor T5 by a connection line disposed in the active layer (the active layer is metallized).

The first electrode A3 of the first compensation transistor T2 is electrically connected to the second electrode A10 of the drive transistor T5 by a connection line disposed in the active layer. The second electrode A4 of the first compensation transistor T2 is connected to the connection line C of the source-drain layer by the second via Via 2. The connection line C is electrically connected to the first capacitor plate Cst1 by the third via Via 3.

A first electrode A5 of the first reset transistor T3 is connected to a connection line D of the source-drain layer by the fourth via Via 4, the connection line D is electrically connected to the Vinit signal line by the fifth via Via 5, and a second electrode A6 of the first reset transistor T3 is electrically connected to the second electrode of the first compensation transistor T2 by the second via Via 2.

A first electrode A7 of the second reset transistor T4 is connected to the connection line E of the source-drain layer by the sixth via Via 6, the connection line is electrically connected to another Vinit signal line by the seventh via Via 7, and a second electrode A8 of the second reset transistor T4 is electrically connected to the second light-emitting control transistor T7 by the connection line in the active layer.

A first electrode A11 of the first light-emitting control transistor T6 is electrically connected to the first electrode A9 of the drive transistor T5 by a connection line in the active layer, and a second electrode A12 of the first light-emitting control transistor T6 is electrically connected to the VDD signal line by the eighth via Via 8.

A first electrode A13 of the second light-emitting control transistor T7 is electrically connected to the second electrode A10 of the drive transistor T5 by a connection line in the active layer, and a second electrode A14 of the second light-emitting control transistor T7 is electrically connected to the light-emitting diode by the ninth via Via 9.

The second capacitor plate Cst2 is electrically connected to the VDD signal line by a tenth via Via 10. The shielding layer 306 is electrically connected to the VDD signal line by the eleventh via Via 11. The first electrode of the first switch transistor T1 is electrically connected to the Data signal line by an eleventh via Via 11, wherein the Data signal line is disposed in the second source-drain layer.

Figure 11:
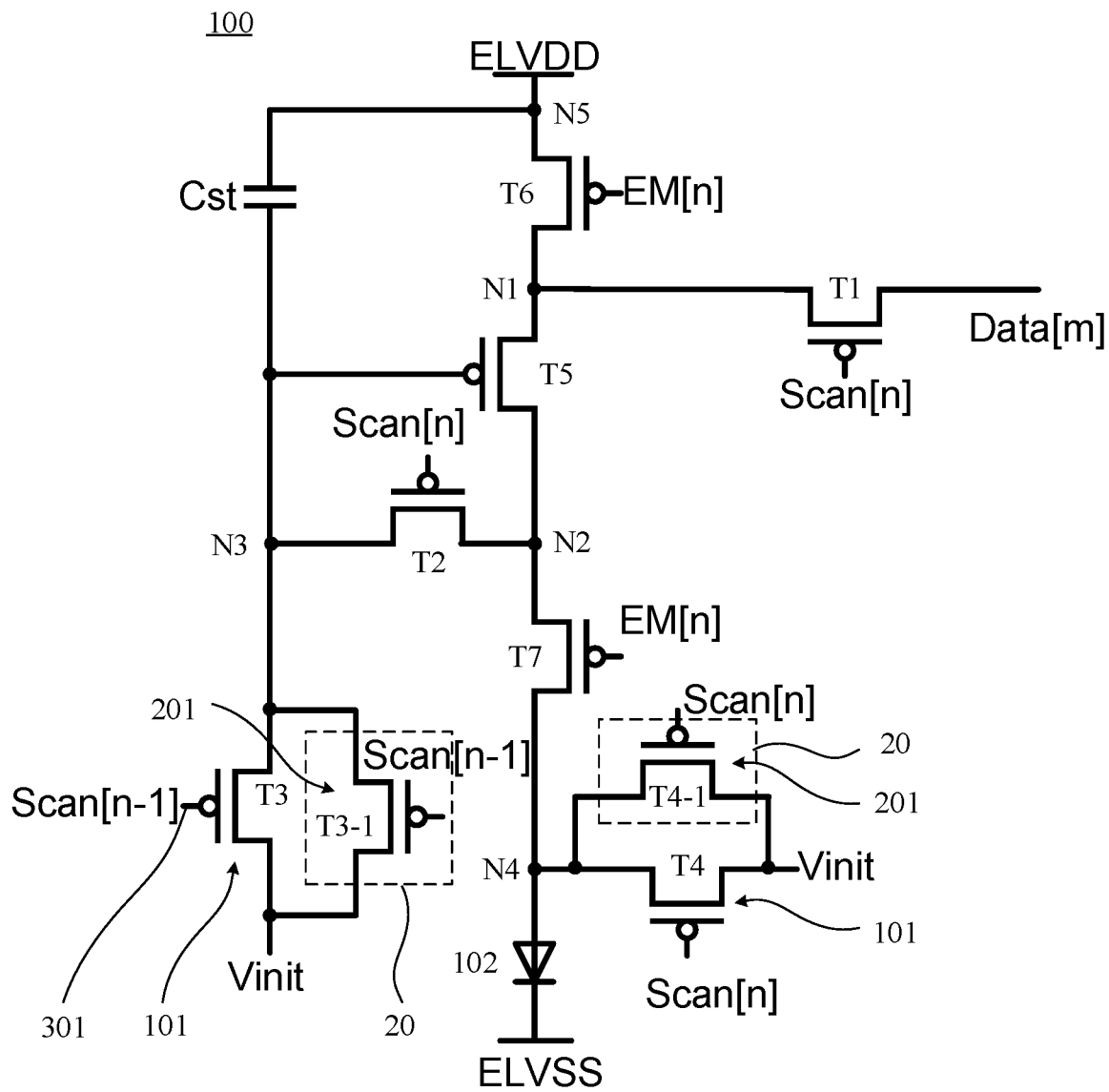
FIG. 11 is a circuit diagram of another dummy pixel circuit according to some embodiments of the present disclosure.

FIG. 11 is a circuit diagram of another dummy pixel circuit according to some embodiments of the present disclosure. Referring to FIG. 11, the first transistor 101 includes a first reset transistor T3 and a second reset transistor T4, and the second transistor 201 includes a third reset transistor T3-1 and a fourth reset transistor T4-1.

The third reset transistor T3-1 corresponds to the first reset transistor T3, and the fourth reset transistor T4-1 corresponds to the second reset transistor T4. That is, the first electrode of the third reset transistor T3-1 is electrically connected to the first electrode of the first reset transistor T3, and the second electrode of the third reset transistor T3-1 is electrically connected to the second electrode of the first reset transistor T3: and the first electrode of the fourth reset transistor T4-1 is electrically connected to the first electrode of the second reset transistor T4, and the second electrode of the fourth reset transistor T4-1 is electrically connected to the second electrode of the second reset transistor T4.

Figure 12:
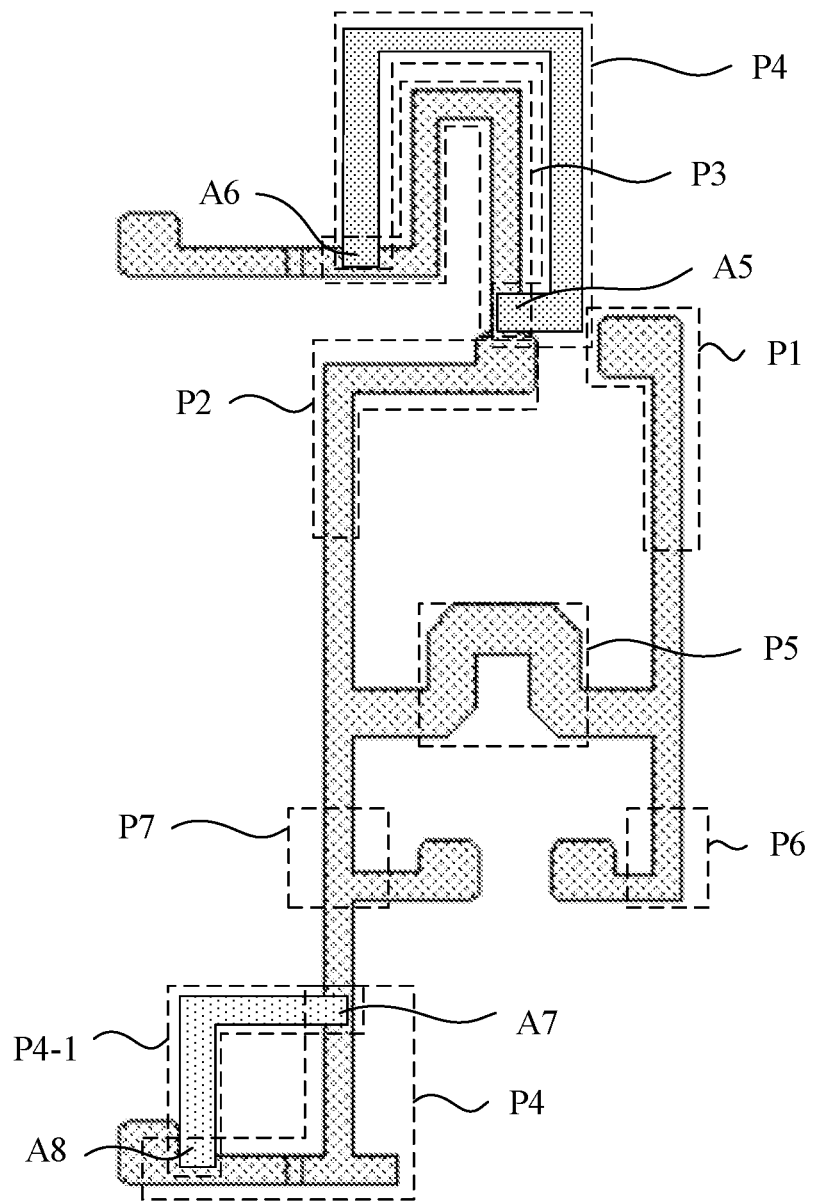
FIG. 12 is a film layer diagram of another active layer according to some embodiments of the present disclosure.

FIG. 12 is a film layer diagram of another active layer according to some embodiments of the present disclosure. The film layer diagram of an active layer in FIG. 12 corresponds to the active layer in the circuit diagram in FIG. 11. Referring to FIG. 12, the first electrode A5 and second electrode A6 of the first reset transistor T3 are both disposed in the active layer 603, and are metallized active layers. Moreover, the third reset transistor T3-1 and the first reset transistor T3 share the same first electrode A5, and the third reset transistor T3-1 and the first reset transistor T3 share the same second electrode A6. The active layer P3-1 of the third reset transistor T3-1 has two overlap parts with the active layer P3 of the first reset transistor T3. The first electrode A5 of the first reset transistor T3 and the third reset transistor T3-1 is one of two overlap parts, and the second electrode A6 of the third reset transistor T3-1 and the first reset transistor T3 is the other of the two overlap parts.

Similarly, the first electrode A7 and the second electrode A8 of the second reset transistor T4 are both disposed in the active layer 603, and are metallized active layers. Moreover, the fourth reset transistor T4-1 and the second reset transistor T4 share the same first electrode A7, and the fourth reset transistor T4-1 and the second reset transistor T4 share the same second electrode A8. The active layer P4-1 of the fourth reset transistor T4-1 has two overlap parts with the active layer P4 of the second reset transistor T4. The first electrode A7 of the fourth reset transistor T4-1 and the second reset transistor T4 is one of two overlap parts, and the second electrode A8 of the fourth reset transistor T4-1 and the second reset transistor T4 is the other of the two overlap parts.

The other film layers in the circuit diagram in FIG. 11 are the same as corresponding film layers in FIGS. 8 to 10 described above, which are not repeated herein.

In some embodiments of the present disclosure, corresponding circuit diagrams in FIG. 4 and FIG. 11 are combined. For example, the first transistor 101 includes a first switch transistor T1, and the second transistor 201 includes a second switch transistor T1-1; or the first transistor 101 includes a first switch transistor T1 and a first reset transistor T3, and the second transistor 201 includes a second switch transistor T1-1 and a third reset transistor T3-1; or the first transistor 101 includes a first switch transistor T1, a first compensation transistor T2, and a first reset transistor T3, and the second transistor 201 includes a second switch transistor T1-1, a second compensation transistor T2-1, and a third reset transistor T3-1; or the first transistor 101 includes a first switch transistor T1, a first compensation transistor T2, a first reset transistor T3, and a second reset transistor T4, and the second transistor 201 includes a second switch transistor T1-1, a second compensation transistor T2-1, a third reset transistor T3-1, and a fourth reset transistor T4-1.

The embodiments of the present disclosure also provide a display panel, wherein the display panel includes the dummy pixel circuit shown in FIG. 3, FIG. 5, or FIG. 11.

In some embodiments of the present disclosure, the display panel further includes a driving circuit. The driving circuit is electrically connected to the pixel circuit by the signal line to provide an electrical signal to the pixel circuit, and thus the display panel is controlled to emit light.

The embodiments of the present disclosure also provide a display device, wherein the display device includes the display panel as described above.

In some embodiments of the present disclosure, the display device according to the embodiments of the present disclosure is any product or component with a display function, such as a mobile phone, a tablet computer, a television, a display, a laptop computer, a digital photo frame, or a navigator.

Described above are merely exemplary embodiments of the present disclosure, and are not intended to limit the present disclosure. Any modification, equivalent substitution, improvement, and the like made should be included in the protection scope of the present disclosure, without departing from the spirit and principle of the present disclosure.

What is claimed is:

1. A dummy pixel circuit, applicable to a display panel provided with two through vias, the dummy pixel circuit being disposed between the two through vias and comprising:
    a pixel sub-circuit comprising one or more first transistors, wherein a control electrode of the first transistor is electrically connected to a first gate line, the first gate line being provided with a bend that bypasses the through via; and
    a dummy sub-circuit comprising one or more second transistors, wherein a control electrode of the second transistor is electrically connected to the first gate line, a first electrode of the second transistor is electrically connected to a first electrode of a corresponding one of the one or more first transistors, and a second electrode of the second transistor is electrically connected to a second electrode of the corresponding first transistor;
    wherein each of the one or more first transistors corresponds to at least one of the one or more second transistors.

2. The dummy pixel circuit according to claim 1, wherein the first transistor comprises a first switch transistor and a first compensation transistor, and the second transistor comprises a second switch transistor and a second compensation transistor; and
    the second switch transistor corresponds to the first switch transistor, and the second compensation transistor corresponds to the first compensation transistor.

3. The dummy pixel circuit according to claim 2, wherein orthographic projections of the first switch transistor and the first compensation transistor on a first surface are between an orthographic projection of the first switch transistor on the first surface and an orthographic projection of the first compensation transistor on the first surface, the first surface being a surface of a base substrate where the dummy pixel circuit is disposed.

4. The dummy pixel circuit according to claim 3, wherein orthographic projections of an active layer of the second compensation transistor and an active layer of the first compensation transistor on the first surface form a rectangular ring; and
    the orthographic projection of the active layer of the second compensation transistor on the first surface form two connected sides of the rectangular ring, and the orthographic projection of the active layer of the first compensation transistor form the other two sides of the rectangular ring.

5. The dummy pixel circuit according to claim 4, wherein an extension direction of one of the other two sides of the rectangular ring is consistent with an extension direction of a connection line in a source-drain layer; and
    one of the other two sides of the rectangular ring is at least partially overlapped with an orthographic projection, of the connection line in the source-drain layer, on the first surface.

6. The dummy pixel circuit according to claim 3, wherein control electrodes of the second compensation transistor and the first compensation transistor are respectively disposed on two sides of the first gate line to which the first switch transistor is connected.

7. The dummy pixel circuit according to claim 6, wherein a connection line between a center of the control electrode of the second compensation transistor and a center of the control electrode of the first compensation transistor is perpendicular to the first gate line.

8. The dummy pixel circuit according to claim 1, wherein the first transistor comprises a first reset transistor and a second reset transistor, and the second transistor comprises a third reset transistor and a fourth reset transistor;
    wherein the third reset transistor corresponds to the first reset transistor, and the fourth reset transistor corresponds to the second reset transistor.

9. The dummy pixel circuit according to claim 1, wherein a number of the second transistors ranges from 1 to 4.

10. The dummy pixel circuit according to claim 1, wherein
    the first electrode of the first transistor and a first electrode of the second transistor connected thereto are disposed in a same layer; and the second electrode of the first transistor and a second electrode of the second transistor connected thereto are disposed in a same layer.

11. The dummy pixel circuit according to claim 10, wherein
the first electrode of the first transistor and a first electrode of a corresponding one of the one or more second transistors are connected together by a trace, and the second electrode of the first transistor and a second electrode of the corresponding second transistor are connected together by a trace.

12. The dummy pixel circuit according to claim 10, wherein
the first transistor and the second transistor share a same first electrode, and the first transistor and the second transistor share a same second electrode.

13. A display panel, comprising: a dummy pixel circuit and a first gate line, wherein the display panel is provided with two through vias therein, the first gate line is provided with a bend that bypasses the through via, the dummy pixel circuit is disposed between the two through vias; and the dummy pixel circuit comprises:
a pixel sub-circuit comprising one or more first transistors, wherein a control electrode of the first transistor is electrically connected to the first gate line; and
a dummy sub-circuit comprising one or more second transistors, wherein a control electrode of the second transistor is electrically connected to the first gate line, a first electrode of the second transistor is electrically connected to a first electrode of a corresponding one of the one or more first transistors, and a second electrode of the second transistor is electrically connected to a second electrode of the corresponding first transistor;
wherein each of the one or more first transistors corresponds to at least one of the one or more second transistors.

14. The display panel according to claim 13, further comprising: a pixel circuit and a second gate line; wherein
a length of the first gate line is greater than a length of the second gate line; and
the pixel circuit and the pixel sub-circuit have an identical circuit structure and the pixel circuit is electrically connected to the second gate line.

15. The display panel according to claim 13, wherein
the first transistor comprises a first switch transistor and a first compensation transistor, and the second transistor comprises a second switch transistor and a second compensation transistor; and
the second switch transistor corresponds to the first switch transistor, and the second compensation transistor corresponds to the first compensation transistor.

16. The display panel according to claim 15, wherein orthographic projections of the first switch transistor and the first compensation transistor on a first surface are between an orthographic projection of the first switch transistor on the first surface and an orthographic projection of the first compensation transistor on the first surface, the first surface being a surface of a base substrate where the dummy pixel circuit is disposed.

17. The display panel according to claim 16, wherein
orthographic projections of an active layer of the second compensation transistor and an active layer of the first compensation transistor on the first surface form a rectangular ring; and
the orthographic projection of the active layer of the second compensation transistor on the first surface form two connected sides of the rectangular ring, and the orthographic projection of the active layer of the first compensation transistor form the other two sides of the rectangular ring.

18. The display panel according to claim 17, wherein
an extension direction of one of the other two sides of the rectangular ring is consistent with an extension direction of a connection line in a source-drain layer; and
one of the other two sides of the rectangular ring is at least partially overlapped with an orthographic projection, of the connection line in the source-drain layer, on the first surface.

19. The display panel according to claim 16, wherein control electrodes of the second compensation transistor and the first compensation transistor are respectively disposed on two sides of the first gate line to which the first switch transistor is connected.

20. A display device, comprising: the display panel as defined in claim 13.

* * * * *